Sept. 18, 1973 J. LAWRENCE 3,759,768

PREFERENTIAL ETCHING OF SILICON

Filed Oct. 27, 1971

United States Patent Office 3,759,768
Patented Sept. 18, 1973

3,759,768
PREFERENTIAL ETCHING OF SILICON

John Lawrence, Ottawa, Ontario, Canada, assignor to Bell Canada-Northern Electric Research Limited, Ottawa, Ontario, Canada Filed Oct. 27, 1971, Ser. No. 192,943
Int. Cl. H01l 7/34
U.S. Cl. 156—17 3 Claims

ABSTRACT OF THE DISCLOSURE

Preferential etching of silicon—typically etching of an n-type silicon material through an etch resilient material, by etching with orthophosphoric acid to which has been added arsenic trioxide. The effective range of additive is between 0.1 gm. and 20 gms. of arsenic trioxide per quart of acid.

This invention relates to the preferential etching of silicon, and in particular to the etching of an n-type silicon material through an etch resilient window with preferential etching at the edges of the window.

In etching silicon, the bottom of a deeply etched area is either flat or slightly concave. Also the cross-section is often enlarged by lateral undercutting of the mask.

The present invention provides for the etching of silicon with an etching solution which has a composition such that the sides of the etched portion are substantially straight and normal to the surface of the main body of material, and with the profile of the bottom of the etched area can be variable from slightly convex to a situation in which the edges of the area are etched into deep grooves while limited or substantially no etching occurs in the central portion, depending upon the etchant composition.

Thus the invention provides for the preferential etching of n-type silicon through an etch resilient window, the etching solution comprising refluxing orthophosphoric acid and arsenic trioxide ($As_2O_3$). The quantity of $As_2O_3$ added to the orthophosphoric acid is variable depending upon desired results, 0.1 gm. $As_2O_3$ in 1 quart of acid giving a slightly convex bottom surface and 1.0 gm. $As_2O_3$ in 1 quart of acid giving deep grooves at the edges of the area defined by the window while the central portion is only slightly etched.

Figure 1:
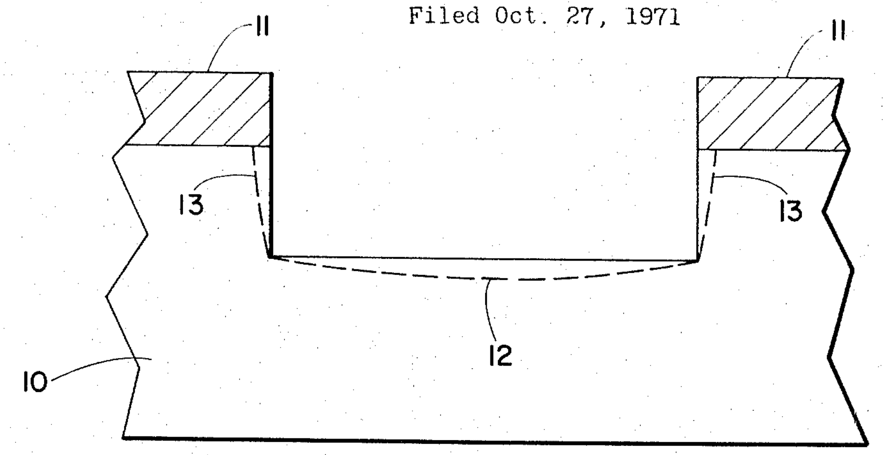
Figure 2:
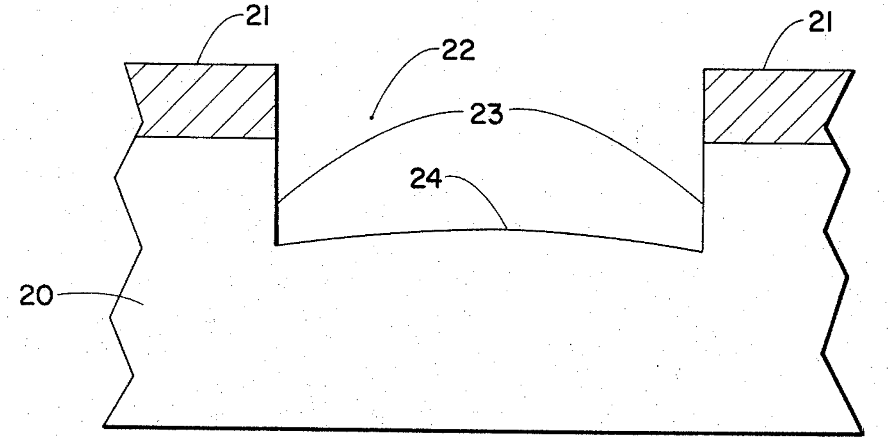
Figure 3:
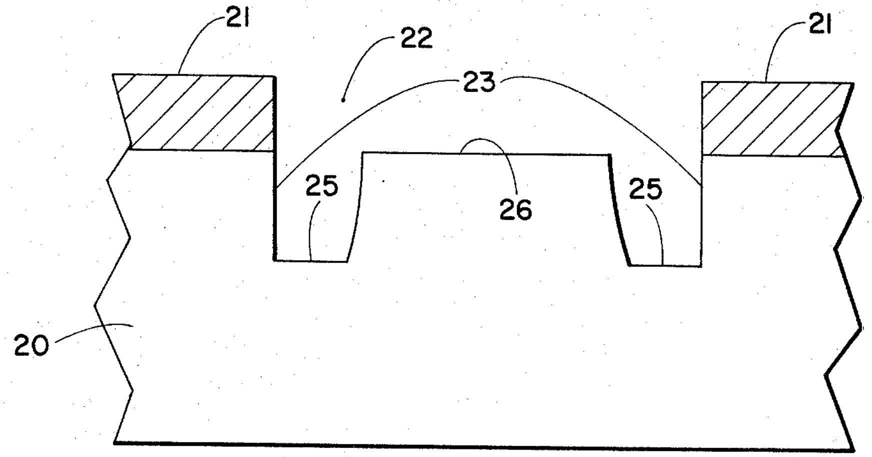

The invention will be readily understood by the following description in conjunction with the accompanying drawings, in which:

FIG. 1 is a diagrammatic cross-section through a silicon wafer which has been etched in a conventional manner; and FIGS. 2 and 3 are diagrammatic cross-sections through silicon wafers which have been etched in accordance with the present invention.

FIG. 1 illustrates a cross-section through a silicon wafer 10 which has been etched with conventional etchants, through a window formed in a layer of silicon dioxide ($SiO_2$) 11. The bottom surface is usually flat as shown, or slightly concave as indicated by the dotted line 12. Further, lateral undercutting often occurs as indicated by the dotted line 13.

It is desirable that no undercutting should occur, and also it is often desired that narrow deep grooves are required at the edge of a window. The present invention provides for the preferential etching of the silicon substrate, the degree of preferential etching being varied by varying the make-up of the etchant solution.

FIG. 2 is a diagrammatic cross-section through a silicon wafer comprising an n-type silicon substrate 20 and a layer of silicon dioxide ($SiO_2$) 21. The layer 21 is formed, in the present example, by thermally growing, and has a thickness of from 1000 A. to 3000 A. The layer 21 is photoengraved in the usual manner and the exposed oxide etched away with buffered hydrofluoric acid, to form a window 22.

The wafer is then further etched by a preferential etchant comprising refluxing orthophosphoric acid (boiling point 165°) to which has been added a small amount of arsenic trioxide ($As_2O_3$). In the example illustrated in FIG. 2 the preferential etchant has 0.1 gm. $As_2O_3$ added to 1 quart of orthophosphoric acid. The sides 23 of the etched portion are straight and normal to the surface of the wafer, and the bottom surface 24 is slightly convex.

The quantity of $As_2O_3$ added varies the characteristics of the preferential etchant considerably. FIG. 3 illustrates a wafer similar to that of FIG. 2, comprising n-type silicon substrate 20, $SiO_2$ layer 21 and window 22. In this example the preferential etchant has 1.0 gm. $As_2O_3$ added to 1 quart of orthophosphoric acid. The sides 23 are straight and normal to the wafer surfaces but it will be seen that very deep grooves 25 have been etched at the sides while the central portion 26 has been etched only to a very small amount.

Further increase in the amount of $As_2O_3$ added to the acid results in wider and shallower grooves until at 20 gm. $As_2O_3$ per quart of orthophosphoric acid preferential etching substantially disappears.

The absolute etch rates depend strongly on the resistivity of the silicon substrate. The etchant is preferential only with n-type silicon; with p-type material the etched surface shows deep pitting uniformly distributed.

What is claimed is:

1. A method of producing preferentially etching silicon devices, comprising: etching an n-type silicon substrate through an etch resistant window with an etchant comprising refluxing phosphoric acid and an additive, the additive being arsenic trioxide in the proportion of between 0.1 gm. and 20 gm. of arsenic trioxide per quart of orthophosphoric acid.

2. A method as claimed in claim 1, the additive being in the range of 0.1 gm. to 1.0 gm. of arsenic trioxide per quart of orthophosphoric acid.

3. A method as claimed in claim 1, the orthophosphoric acid having a boiling point of at least 165° C.

References Cited

UNITED STATES PATENTS

| | | | |
|---|---|---|---|
| 3,355,330 | 12/1967 | Rothkegal et al. | 148—6.15 |
| 3,671,437 | 6/1972 | Pless | 156—17 |

OTHER REFERENCES

Carballo, R. A.: 'Staining Solution," IBM Technical Disclosure Bulletin, vol. 13, No. 7, December 1970.

ALFRED L. LEAVITT, Primary Examiner
J. MASSIE, Assistant Examiner